(12) United States Patent
Scheytt

(10) Patent No.: US 8,115,543 B2
(45) Date of Patent: Feb. 14, 2012

(54) MIXED-SIGNAL TRANSMISSION CIRCUIT FOR SWITCHING POWER AMPLIFIERS

(75) Inventor: Johann Christoph Scheytt, Frankfurt (DE)

(73) Assignee: IHP GmbH—Innovations for High Performance Microelectronics/Leibniz—Institut fur Innovative Mikroelektronik, Frankfurt (Oder) (DE)

( * ) Notice: Subject to any disclaimer, the term of this patent is extended or adjusted under 35 U.S.C. 154(b) by 0 days.

(21) Appl. No.: 12/998,946

(22) PCT Filed: Dec. 4, 2009

(86) PCT No.: PCT/EP2009/066457
§ 371 (c)(1),
(2), (4) Date: Sep. 2, 2011

(87) PCT Pub. No.: WO2010/072550
PCT Pub. Date: Jul. 1, 2010

(65) Prior Publication Data
US 2011/0316625 A1    Dec. 29, 2011

(30) Foreign Application Priority Data
Dec. 16, 2008   (DE) .......................... 10 2008 054 772

(51) Int. Cl.
*H03F 3/38* (2006.01)
(52) U.S. Cl. ........................ 330/10; 330/207 A; 330/251
(58) Field of Classification Search .................... 330/10, 330/207 A, 251
See application file for complete search history.

(56) References Cited

U.S. PATENT DOCUMENTS

| 3,900,823 | A  | * | 8/1975  | Sokal et al. ................... 330/149 |
| 7,280,003 | B2 | * | 10/2007 | Belot et al. .................... 332/144 |
| 7,522,676 | B2 | * | 4/2009  | Matero ......................... 375/295 |
| 7,773,669 | B2 | * | 8/2010  | Degani et al. .................. 375/239 |
| 2010/0091828 | A1 | * | 4/2010 | Mayer et al. .................. 375/226 |
| 2010/0124889 | A1 | * | 5/2010 | Osman et al. .................. 455/108 |

FOREIGN PATENT DOCUMENTS

| WO | WO 98/44626    | 10/1998 |
| WO | WO 2007/117075 | 10/2007 |

OTHER PUBLICATIONS

European Patent Office; Van den Doel, J.; "International Search Report"; whole document; Mar. 26, 2010.

* cited by examiner

*Primary Examiner* — Patricia Nguyen
(74) *Attorney, Agent, or Firm* — Ware, Fressola, Van Der Sluys & Adolphson LLP

(57) ABSTRACT

The invention relates to an upstream unit (1) for a switched power amplifier (2) for a high-frequency transmission circuit (16). The upstream unit (1) supplies a pulse-length modulated HF pulse signal (22) to the switched power amplifier (2), wherein the linearity of the pulse length modulation and of the high-frequency transmission circuit is improved. The upstream unit (1) according to the invention has a first signal input (3) for a high-frequency, phase-modulated first input signal (18), a second signal input (4) for a second input signal (19) having a low frequency in comparison with the first input signal, a controllable first delay unit (5), a controllable second delay unit (7), a pulse generator (9) and a control unit (10).

15 Claims, 6 Drawing Sheets

MIXED-SIGNAL TRANSMISSION CIRCUIT FOR SWITCHING POWER AMPLIFIERS

CROSS REFERENCE TO RELATED APPLICATIONS

This application is the U.S. National Stage of International Application No. PCT/EP2009/066457 filed on Dec. 4, 2009 which was published in German on Jul. 1, 2010 under International Publication Number WO 2010/072550, which International Application in turn claims the benefit of German Application No. DE 10 2008 054 772.7 filed Dec. 16, 2008.

BACKGROUND OF THE INVENTION

1. Technical Field

The invention relates to an upstream unit for a switched power amplifier of a high-frequency transmission circuit. An upstream unit according to the invention may be used in wireless communication, in multiband and in multistandard radio transmitters, for example.

2. Discussion of Related Art

Switched power amplifiers typically include an amplifier, which is an active circuit, and a reconstruction filter. It is possible with such switched power amplifiers to realize low-loss transmission circuits, for example for wireless communication. The switched power amplifier is driven by high-frequency pulse signals. These must have an amplitude that is sufficiently high and sufficiently constant. Pulse-length modulated signals generated by pulse length modulation (PLM) are specifically suitable as pulse signals. A high-frequency pulse-length modulated pulse signal is therefore generated in an upstream unit for a switched power amplifier and supplied to the switched power amplifier. The latter amplifies the pulse-length modulated pulse signal and supplies it to a reconstruction filter. A modulated high-frequency current signal (HF signal), which is emitted from an antenna, is thus produced at the output of the reconstruction filter.

In pulse length modulation, a pulse length is generally controlled by a threshold value. The length of a pulse is meant to be linearly dependent on the threshold value. However, this linearity in pulse length modulation can only be achieved to an approximate degree in real systems.

In an upstream unit for a switched power amplifier according to the prior art, for example, a phase modulated HF signal is converted by a limiting amplifier into an HF pulse signal in the form of a square wave signal. This pulse signal is converted into an HF triangle wave signal by an integrator. A comparator then compares the momentary amplitude of the HF triangle wave signal with a slow threshold value that varies as a function of time. Depending on the result of that comparison, the comparator outputs a high or a low signal level, which means that a pulse-length modulated HF pulse signal is produced at the output of the comparator. The duration of a pulse is thus controlled by the threshold value. The relationship between the threshold value and the length of a pulse in the pulse-length modulated HF pulse signal is only approximately linear, however. To achieve a high degree of linearity, the HF triangle wave signal must be generated with maximum precision. This requires the HF pulse signal of the limiting amplifier to have a very high edge steepness, firstly, which can be achieved by the limiting amplifier to an approximate degree only. It is also necessary that an integrator which converts an HF pulse signal into an HF triangle wave signal is able to tolerate very short rise times of the input signal. Another requirement is that the HF triangle wave signal must itself have a relatively short rise time so that a sufficiently large signal amplitude is achieved within a high-frequency period, in order to be able to compare the amplitude of the triangle wave signal with a threshold value in the comparator. In a real HF transmission circuit, such requirements can only be fulfilled to an approximate degree, which means that the pulse length of the pulse-length modulated HF pulse signal is generally nonlinearly dependent on the threshold value.

Before the pulse-length modulated HF pulse signal generated by the upstream unit is reconstructed by a reconstruction filter as a transmission signal to be sent to the antenna, it needs to be amplified. Switched power amplifier may be used to perform such amplification. In the case of very small or very large pulse widths of the pulse-length modulated HF pulse signal, the switched power amplifier might not reach its full output amplitude at its output. This means that the relationship between the input signal and the output signal of a switched power amplifier is likewise only approximately linear. This further reduces the linearity between the threshold value and the amplified output signal of the comparator, i.e., the amplified pulse-length modulated HF pulse signal.

If, in the case of digital modulation methods used in many wireless communication systems, the degree of linearity in an HF transmission circuit is low, as described above, this may lead to the receiver being unable to detect digital symbols reliably, and hence to bit errors occurring.

The steepness of the HF triangle wave signal may also be dependent on process and temperature variations, and therefore fluctuate heavily, for example when the upstream unit is realized as a microelectronic circuit. This may result, for example, in an integrator used in the upstream unit having to be calibrated for variations in temperature, for example.

The amplitude of the HF triangle wave signal may also change, in upstream units of the kind considered so far, when the carrier frequency of the phase modulated HF signal changes. Such an upstream unit is therefore suitable to a limited degree only for applications requiring different carrier frequencies, such as multiband or multistandard applications.

Switched power amplifiers typically exhibit asymmetric switching behavior as well. That is to say, there are differences in the steepness of the rising and falling edges of the output signal of the switched power amplifier. After reconstruction of the output signal of the switched power amplifier to form an HF transmission signal, this unequal edge steepness may lead to unwanted phase modulation of the HF transmission signal that is emitted by the antenna. Attention is drawn to the fact that the prior art and the problems associated therewith are also discussed with reference to FIG. 1.

DISCLOSURE OF INVENTION

The object of the invention is to solve at least partly the aforementioned problems in the prior art and in particular to design an upstream unit for a switched power amplifier of an HF transmission circuit, with behavior that is as linear as possible.

This object is achieved with an upstream unit for a switched power amplifier of a high-frequency transmission circuit, comprising a first signal input for a high-frequency, phase modulated first input signal; a second signal input for a second input signal having a low frequency in comparison with the first input signal; a controllable first delay unit to which the first input signal is supplied and to which a first control signal is supplied via a first control input and which is configured to output the first input signal with a first delay that depends on the first control signal; a controllable second delay unit to which the first input signal is supplied and to which a second control signal is supplied via a second control input and which is configured to output the first input signal with a second delay that depends on the second control signal and which is longer than the first delay; a pulse generator which is connected on the input side to the first and to the second delay unit and configured to generate and output a pulsed and pulse-length modulated output signal, wherein the duration of the rising edges of the output signal from the pulse generator depends on the output signal from the first delay unit and the duration of the falling edges of the output signal from the pulse generator depend on the output signal from the second delay unit; and a control unit which is configured to generate and output the first control signal according to the second input signal and the output signal from the pulse generator and to generate and output the second control signal according to the second input signal and the output signal from the pulse generator.

The upstream unit serves in particular to provide a pulse-length modulated HF pulse signal for a switched power amplifier. What is generally meant by a "pulse signal" is a square wave signal. A high-frequency, phase-modulated first input signal can be supplied to a first signal input. This first input signal has the form $\sin(\omega_{RF}*t+\phi_{RF}(t))$, for example, where $\omega_{RF}$ is the carrier frequency, t the time and $\phi_{RF}$ the momentary phase of the signal. However, the first input signal may also be an HF pulse signal with the form $\text{sign}(\sin(\omega_{RF}*t+\phi_{RF}(t)))$, where "sign" is the signum function. A second input signal, which may be a baseband signal, is supplied to the second signal input. This baseband signal may represent the amplitude envelope or the amplitude information of a desired transmission signal, for example. The second input signal can thus be used for amplitude modulation. It has the form a(t), for example, where a is an amplitude that is a function of time t.

The controllable first delay unit and the controllable second delay unit are used to output the first input signal with a first delay and a second delay, respectively. These two delays differ, with the result that two signals offset in time from each other are present at the output of the two delay units. The first delay and the second delay can be controlled, so the timing offset between the output signal of the first delay unit and the output signal of the second delay unit is likewise controllable.

The output signal of the first delay unit and the output signal of the second delay unit are supplied to a pulse generator, which generates a pulsed and pulse-length modulated HF output signal—for example, in that the rising edge of the output signal of the pulse generator is triggered by the rising edge of the output signal of the first delay unit, and the falling edge of the output signal of the pulse generator is triggered by the rising edge of the output signal of the second delay unit. In this way, the pulse widths of the output signal of the pulse generator can be controlled by the positions in time of the falling and/or rising edges of the output signal of the first delay unit and of the output signal of the second delay unit. The positions in time are controlled, in turn, by the first delay and the second delay.

The pulse generator is preferably realized as a flip-flop with set-reset input.

The first delay and the second delay are controlled by a control unit. In order to determine the respective control signals, namely the first control signal and the second control signal, the second input signal of the upstream unit and the output signal of the pulse generator, or signals depending on those two signals, are available to the control unit. The first and the second control signal may then be determined in the control unit in such a way that a specific criteria is fulfilled, or a specific interrelationship between the second input signal of the upstream unit and the output signal of the pulse generator is achieved. For example, such an interrelationship may be that a DC signal determined from the output signal of the pulse generator shall be the same as the second input signal. This means that the second input signal of the upstream unit and the output signal of the pulse generator exert an influence on the first control signal and the second control signal, hence on the first delay and the second delay and hence on the pulse width of the output signal of the pulse generator. A change in the second input signal can thus cause a change in the pulse width of the output signal of the pulse generator. The pulse width of the output signal of the pulse generator can thus be controlled via the second input signal.

One essential idea of the present invention is that a pulse-length modulated HF pulse signal provided by the upstream unit is fed back directly or indirectly to a control unit in which the first and second delays are suitably adjusted by comparing that signal with the second input signal. With this feedback of the output signal of the pulse generator, it is possible to reduce nonlinearities in the generation of a pulse-length modulated HF pulse signal and also nonlinearities in the amplification of that signal in the switched power amplifier.

An upstream unit according to the invention is well suited for integration in microelectronics circuits. It has low complexity and is composed of simple components. In comparison with an upstream unit according to the prior art—cf. FIG. 1 and the associated discussion—a precision HF triangle wave signal is not required, meaning that the linearity of the pulse-length modulation is not reduced by an imprecise HF triangle wave signal. The upstream unit according to the invention is also suitable for carrying out pulse-length modulation for different carrier frequencies, so the respective upstream unit is also well suited to multiband and multistandard applications.

In one development of the invention, the control unit includes a comparator unit which is configured to determine the first control signal and the second control signal on the basis of a comparison between a comparison signal which depends on the second input signal and at least one feedback signal which depends on the output signal.

With the second input signal it is possible, for example, to control a pulse length of the output signal of the pulse generator. The aim can be to double the pulse length by doubling the amplitude of the second input signal, for example. However, the actual pulse length may deviate from the desired pulse length of the output signal of the pulse generator due to various circuitry influences, in particular due to various nonlinearities. A feedback signal carrying a respective item of information, for example about the actual pulse length of the output signal of the pulse generator, is therefore provided along with the second input signal of a control unit. More particularly, a comparison between a measure for the actual pulse length and a measure for the desired pulse length may be used to adjust the first delay and the second delay in such a way that the actual pulse length matches the desired pulse length better. In this way, the behaviour of the upstream unit and the HF transmission circuit is linearized. Comparing a comparison signal with a feedback signal, representing a measure for the desired pulse length and for the actual pulse length, respectively, is suitable for implementing a respective upstream unit of low complexity.

In one development of the invention, the comparator unit includes at least one adder unit which is configured to determine a difference signal from the comparison signal and the at least one feedback signal.

The adder unit specifically includes an adder which determines a sum signal from the comparison signal and a feedback signal. The adder unit is supplied the at least one feedback signal and the comparison signal. Before these signals are added, the feedback signal is inverted, for example, so that the sum signal obtained is equal to said difference signal. For two feedback signals, for example, it is also possible to use two adders which then determine a first and a second difference signal. Two adders may be schematically combined as one adder unit. In particular, it is possible with little complexity to compare signals on the basis of addition or subtraction of signals.

In one development of the invention, the comparator unit includes at least one integrator unit which is configured to determine the first control signal in inverted form and/or the second control signal by integrating the at least one difference signal.

An integrator unit may include, for example, a first integrator to which a first difference signal of the first adder is supplied and a second integrator to which a second difference signal of a second adder is supplied. The output of the first integrator may be inverted, for example, and the output of the second integrator may remain unchanged. The output of an inverter connected downstream from the first integrator can thus supply the first control signal to the first control input, whereas the output of the second integrator can be supplied directly to the second control input. It is also possible, for example, to use only one adder and one integrator, the output signal of the integrator being applied to the second control input, and after an additional inversion to the first control input.-{ }-

The at least one integrator unit is preferably realized with at least one integrator based on at least one operational amplifier.

Integrators based on operational amplifiers generally have high DC gain. By means of a suitably high DC gain, the linearity of the circuit can be assured over the entire range of control. With suitably strong amplification, it is also possible to dispense calibration of the integrator unit, which may otherwise be necessary in the prior art.

In one development of the development, the control unit includes at least one coupler which is configured to decouple a measuring signal from the output signal of the pulse generator or from a signal that depends on the output signal of the pulse generator.

The coupler preferably decouples a measuring signal from the output signal of the switched power amplifier, for example by decoupling a small part of the signal power of the output signal of the switched power amplifier. If the measuring signal is decoupled downstream from the switched power amplifier, nonlinearities of the switched power amplifier are also compensated, which may occur at very small and very large pulse widths, in particular. The coupler is preferably arranged downstream from a reconstruction filter. The coupler is then configured to decouple part of the signal power of a reconstructed signal as a measuring signal. It is possible to dispense with a coupler, for example when the output signal of the pulse generator is used as measuring signal.

The control unit preferably includes a second limiting amplifier which is configured to determine the measuring signal from a signal which is filtered by a reconstruction filter and dependent on the output signal.

The second limiting amplifier may, for example, convert a pulse-length modulated HF signal, which is supplied, for example, as a transmission signal to an antenna, into a pulse signal. This may facilitate signal comparison.

In one development of the invention, the control unit includes an amplitude detector which is configured to detect the at least one feedback signal from the measuring signal by rectification.

The amplitude detector is specifically configured to convert the measuring signal, which is generally a high-frequency AC signal, into a DC signal. The average value of the DC signal may be proportional to the pulse width of the measuring signal, for example, to the pulse width of the output signal of the pulse generator, or to the pulse width of the output signal of the switched power amplifier. The amplitude detector is realized in the form of a rectifier, for example.

The coupler, the amplitude detector, the integrator unit and the adder unit are parts of the control unit that serve to feed the pulse width of the output signal of the switched power amplifier back to the first delay unit and the second delay unit. More particularly, the first delay and the second delay are to be regulated in such a way that the first difference signal and the second difference signal are averaged to zero at the inputs of the first integrator and the second integrator.

In another development of the invention, the upstream unit comprises a third delay unit to which the first input signal is supplied and which is configured to output the first input signal with a third constant delay, wherein the output signal is supplied to the third delay unit and the measuring signal is supplied to a phase detection unit which is configured to detect the at least one feedback signal from the output signal of the third delay unit and from the measuring signal in such a way that the at least one feedback signal is proportional to a phase difference between the output signal of the third delay unit and the measuring signal.

The phase detection unit includes, for example, a first phase measuring element and a second phase measuring element, wherein the first phase measuring element detects the positive edge and the second phase measuring element detects the negative edge of the measuring signal. The phase measuring members are specifically configured in such a way that their output signal is proportional to a measured phase difference at their inputs.

The phase difference is the difference between the edge times of two pulse signals. The actual pulse length of the output signal of the switched power amplifier can be adjusted, for example, by adjusting the first delay and the second delay in such a way that the difference between the output signal of the first phase measuring element and the second input signal, and the difference between the output signal of the second phase measuring element and the second input signal, are averaged to zero. With this development of the invention it is possible, for example, to compensate any asymmetric switching behavior of the switched power amplifier.

The phase detection unit preferably includes a first phase measuring element and a second phase measuring element, realized in the form of XOR gates, the second phase measuring element additionally having an inverter at one of its inputs. The XOR gate is preferably implemented in differential circuit technology.

In one development of the upstream unit, a first limiting amplifier is connected downstream from the first signal input and is configured to convert the high-frequency, phase modulated first input signal into a high-frequency, phase modulated, pulsed input signal.

Pulse signals are preferably supplied to the first delay unit, the second delay unit and the pulse generator. If an input signal is present as a sinusoidal signal, it is preferable that it be firstly converted into a pulsed first input signal. Following this conversion, a high-frequency phase-modulated, pulsed first input signal takes the place of the high-frequency phase-modulated first input signal.

In another development of the upstream unit, a pulse-amplitude-to-pulse-length converter is connected downstream from the second signal input and is configured to convert the second input signal into the comparison signal.

The pulse-amplitude-to-pulse-length converter mainly serves to convert the second input signal, which is generally a baseband signal, into a respective control variable for the pulse length of the output signal of the switched power amplifier. Conversion of the second input signal into the comparison signal may be carried out, for example, by multiplying the second input signal by a constant value.

The pulse-amplitude-to-pulse-length converter is preferably constructed with a digital memory comprising an address word input and a data word output and a digital-to-analog converter. The data word output of the digital memory is connected to the input of the digital-to-analog converter. The address word at the input of the digital memory then determines the data word at the output of the digital memory. In this way, it is possible for any characteristic curves of the pulse-amplitude-to-pulse-length converter to be realized with a high level of precision.

According to another aspect of the invention, a circuit unit comprises the upstream unit in combination with a switched power amplifier. According to yet another aspect of the invention, a high-frequency circuit module comprises the circuit unit and a reconstruction filter. According to a further aspect of the invention, a high-frequency transmission circuit comprises a high-frequency switching module and an antenna.

According to yet another aspect of the invention, a transmission device comprises a high-frequency transmission circuit. Such a transmission device can be a mobile telephone, for example.

BRIEF DESCRIPTION OF THE DRAWINGS

In the following, the invention and the technical context are explained in greater detail with reference to the Figures, which show in schematic form.

DETAILED DESCRIPTION

Figure 1:
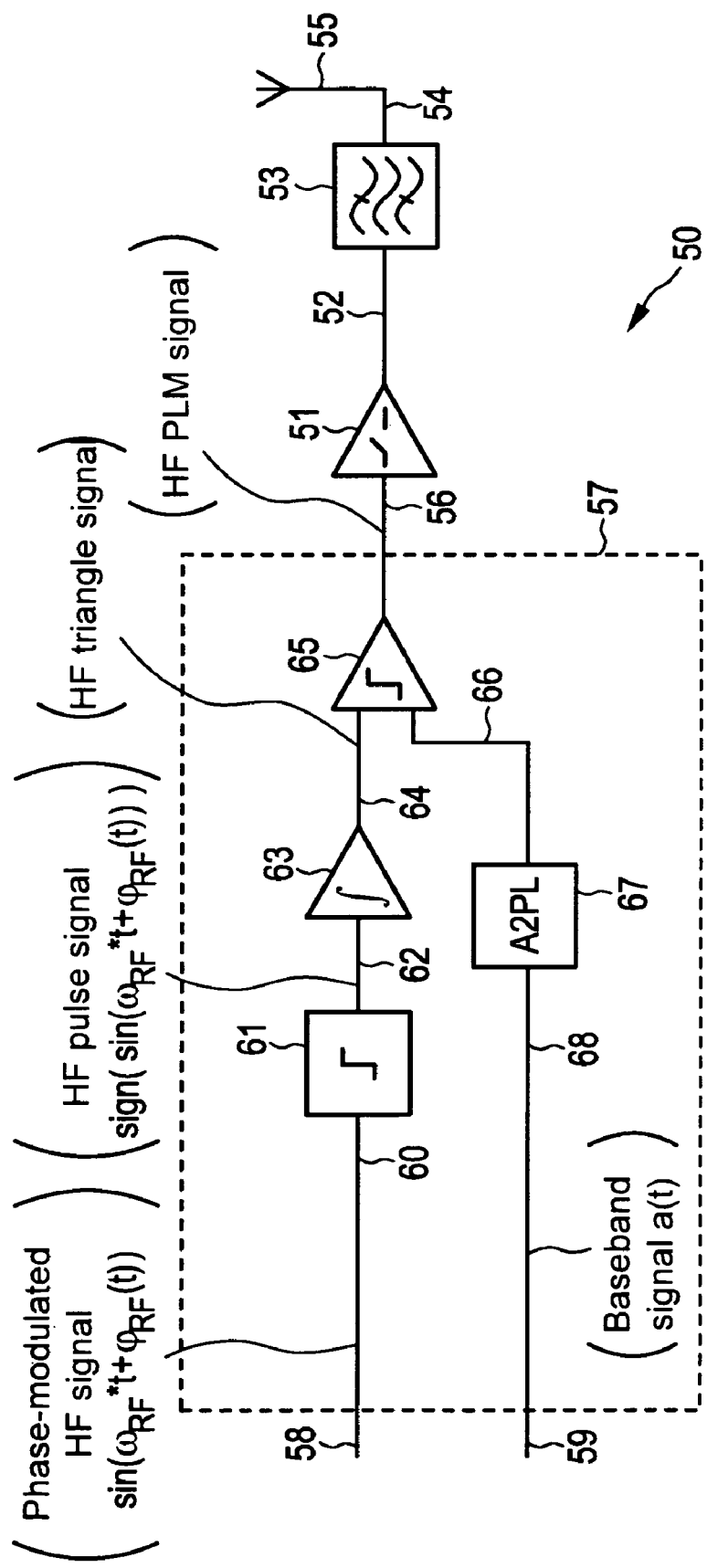
FIG. 1 an upstream unit for a switched power amplifier of a high-frequency transmission circuit according to the prior art, FIG. 2 a first preferred embodiment of the upstream unit according to the invention, for a switched power amplifier of a high-frequency transmission circuit, FIG. 3 a second embodiment of the upstream unit according to the invention, for a switched power amplifier of a high-frequency transmission circuit, FIG. 4 a third embodiment of the upstream unit according to the invention, for a switched power amplifier of a high-frequency transmission circuit, FIG. 5 a fourth embodiment of the upstream unit according to the invention, for a switched power amplifier of a high-frequency transmission circuit, FIG. 6 units which include an upstream unit according to the invention.

FIG. 1 shows a high-frequency transmission circuit 50 containing an upstream unit 57 which is connected on its output side to a switched power amplifier 51. An output signal 52 of the switched power amplifier 51 is supplied to a reconstruction filter 53. An output signal 54 from the reconstruction filter 53 is supplied to an antenna 55 and emitted by the latter. A pulse-length modulated HF pulse signal 56 is outputted from the upstream unit 57 to the switched power amplifier 51. Upstream unit 57 comprises a first signal input 58 and a second signal input 59. A phase modulated HF signal 60 with the form $\sin(\omega_{RF}*t+\phi_{RF}(t))$ arrives via the first signal input 58 to upstream unit 57. $\omega_{RF}$ is the carrier frequency of the phase modulated HF signal 60, $\phi_{RF}$ is the phase of the phase modulated HF signal and t is the time. In a limiting amplifier 61, the phase modulated HF signal 60 is converted into an HF pulse signal 62. The HF pulse signal 62 has the form sign(sin $(\omega_{RF}*t+\phi_{RF}(t))$), where "sign" denotes the signum function. The HF pulse signal 62 is converted in an integrator 63 into an HF triangle wave signal 64 which is supplier to a comparator 65. In addition to the HF triangle wave signal 64, the comparator 65 is also supplied a slow threshold value 66 that varies as a function of time. Threshold value 66 is outputted from a pulse-amplitude-to-pulse-length converter 67, which determines this threshold value 66 from a baseband signal 68 which is supplied to the second signal input 59. Comparator 65 compares the amplitude of the HF triangle wave signal 64 with the slow threshold value 66 and, depending on the result of that comparison, outputs the pulse-length modulated HF pulse signal 56 to the switched power amplifier 51.

In the ideal case, the switched power amplifier 51 amplifies the pulse-length modulated HF pulse signal 56 by the factor K. The reconstruction filter 53 has a narrow bandwidth about the carrier frequency $\omega_{RF}$, with the result that, in a first approximation, a desired signal with the form $K*a(t)*\sin(\omega_{RF}*t+\phi_{RF}(t))$ is applied at the antenna. To achieve as linear a relationship as possible between the pulse length of a pulse in the pulse-length modulated HF pulse signal 56 and threshold value 66, the HF triangle wave signal 64 must be generated with a high level of precision. This requires, for example, that the HF pulse signal 62 has a very high edge steepness at the output of the limiting amplifier 61, and that integrator 63 is able to tolerate very short rise times of the HF pulse signal 62. Because the bandwidth of the electronic circuit is limited, the signal structures of the HF triangle wave signal 64 undergo rounding. In order to obtain sharply resolves peaks and sharply resolved troughs in the triangle wave signal, a very large bandwidth that may be up to ten times the signal frequency would be necessary.

Furthermore, the switched power amplifier 51 generally amplifies the pulse-length modulated HF pulse signal 56 in an approximately linear manner only, i.e. only approximately with a constant factor K. In the case of very short or very long pulse lengths of the pulse modulated HF signal 56 at the input of the switched power amplifier 51, the switched power amplifier 51 generally does not reach its full output amplitude at its output, so the behaviour of the switched power amplifier 51 is generally not ideally linear, either.

When the upstream unit 57 is realized as a microelectronic circuit, the steepness of the HF triangle wave signal 64 may be dependent on process and temperature variations, which may necessitate calibration of integrator 63. A change in the carrier frequency $\omega_{RF}$ also causes a change in the amplitude of the HF triangle wave signal 64. The edge steepness of rising and falling edges of the output signal 52 of the switched power amplifier 51 are generally only approximately symmetrical to each other, which may cause unwanted phase modulation in the output signal 54 of the reconstruction filter 53 in the circuit according to FIG. 1. The rounded or non-ideal peaks of the HF triangle wave signal 64 also cause the modulator to behave nonlinearly.

Figure 2:
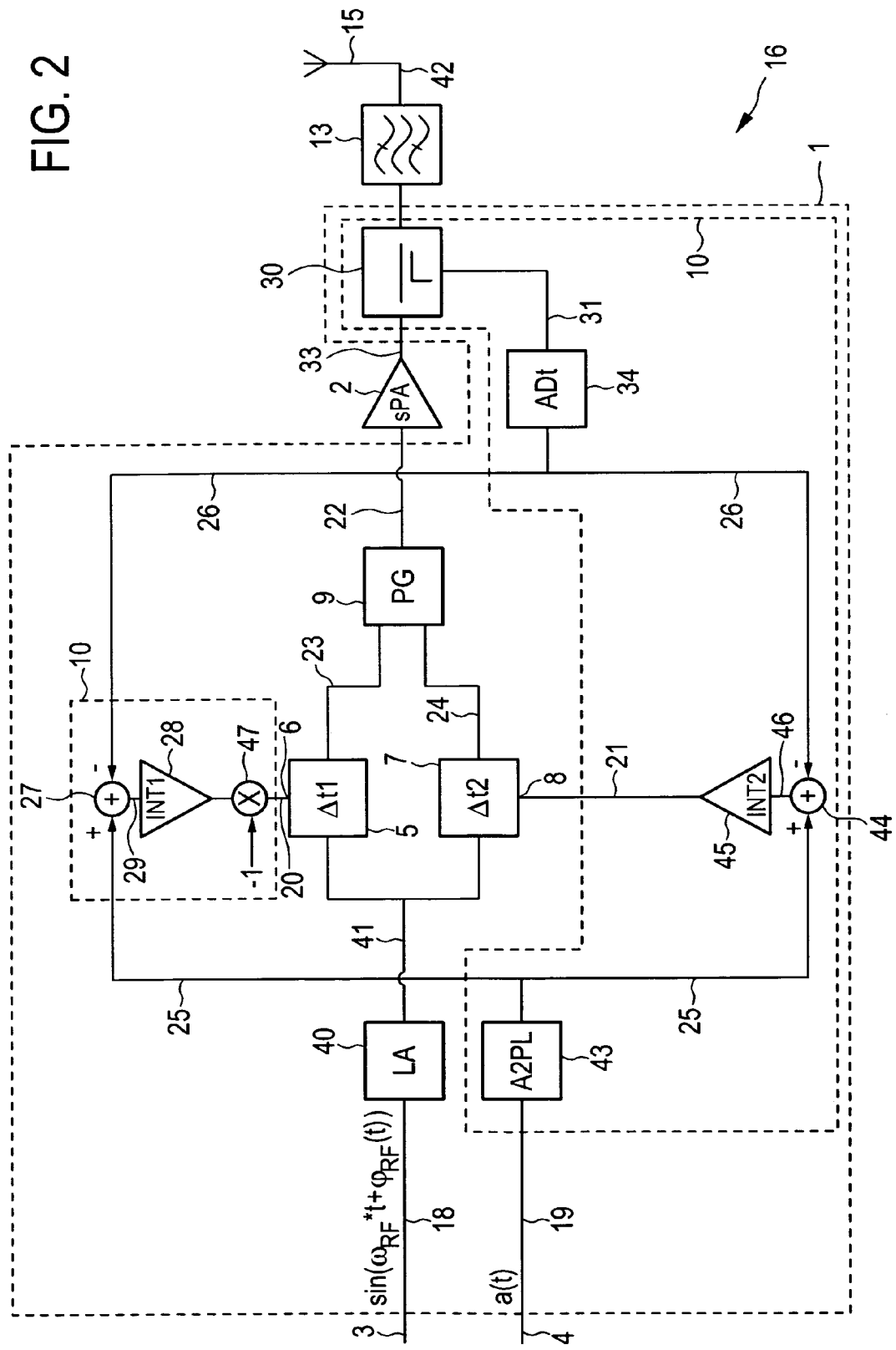

FIG. 2 shows a high-frequency transmission circuit 16 comprising an inventive upstream unit 1 for a switched power amplifier 2, with which the aim is to improve a linearity of the pulse length modulation in comparison with the pulse length modulation according to FIG. 1. A high-frequency, phase-modulated first input signal 18 with the form $\sin(\omega_{RF}*t+\phi_{RF}(t))$ is supplied to a first signal input 3. A first limiting amplifier 40 converts the high-frequency phase-modulated first input signal 18 into a high-frequency phase-modulated pulsed first input signal 41. The pulsed first input signal 41 is supplied to first delay unit 5 and to a second delay unit 7. The first delay produced by the first delay unit 5 can be controlled via a first control signal 20 which is supplied to the first delay unit 5 via a first control input 6.

The second delay produced by the second delay unit 7 is controlled via a second control signal 21 which is applied to a second control input 8. An output signal 23 from the first delay unit 5 and an output signal 24 from the second delay unit 7 are thus delayed forms of the pulsed first input signal 41, according to the adjusted first delay and the adjusted second delay, and are supplied to a pulse generator 9. The first delay differs generally from the second delay.

Pulse generator 9 then generates an output signal 22 in such a form that the rising edge of output signal 22 from the pulse generator 9 coincides with the rising edge of output signal 23 of the first delay unit 5 and the falling edge of output signal 22 from pulse generator 9 coincides with the rising edge of output signal 24 from the second delay unit 7. Output signal 22 is a pulse-length modulated HF pulse signal, since the length of a pulse of output signal 22 can be adjusted by the first delay and the second delay. Output signal 22 is supplied to switched power amplifier 2, which amplifies the signal and outputs an amplified output signal 33. Amplified output signal 33 is fed via a coupler 30 to a reconstruction filter 13 that filters output signal 33 and passes an HF transmission signal 42 to an antenna 15.

Part of the signal power of output signal 33 from switched amplified 2 is decoupled by coupler 30 and supplied as a measuring signal 31 to an amplitude detector 34. Amplitude detector 34 outputs a feedback signal 26 to a first adder 27 and to a second adder 44.

A second input signal 19 is supplied to a second signal input 4 of upstream unit 1. This second input signal 19, which is generally a baseband signal, is supplied to a pulse-amplitude-to-pulse-length converter 43, which provides at its output a comparison signal 25 that is supplied to first adder 27 and second adder 44.

The first adder 27 outputs a first difference signal 29 which equals the difference between comparison signal 25 and feedback signal 26. The second adder 44 outputs a second difference signal 46 which equals the first difference signal 29. The first difference signal 29 is supplied to a first integrator 28. The output signal from first integrator 28 is inverted by means of an inverter 47 and supplied to the first control input 6 as the first control signal 20. The second difference signal 46 is supplied to a second integrator 45, which provides at its output the second control signal 21 which is supplied to second control input 8.

Upstream unit 1 has a first signal input 3 and a second signal input 4 and at its output provides output signal 22 from pulse generator 9. The latter signal is a pulse-length modulated HF pulse signal. Measuring signal 31 and feedback signal 26 are also supplied via a feedback path in upstream unit 1 via coupler 30.

The first delay and the second delay are each controlled by a control unit 10, which is also shown schematically into FIG. 2. It includes coupler 30, amplitude detector 34, first adder 27, second adder 44, first integrator 28, second integrator 45, inverter 47 and the pulse-amplitude-to-pulse-length converter 43.

The high-frequency phase-modulated first input signal 18 is applied in the form $\sin(\omega_{RF}*t+\phi_{RF}(t))$ to the first signal input 3, and the second input signal 19 equal to baseband signal $a(t)$ is applied to the second signal input 4. The first input signal 18 contains the carrier frequency $\omega_{RF}$ and the momentary phase $\phi_{RF}(t)$. Baseband signal $a(t)$, which is the same as the second input signal 19, represents the amplitude envelope or amplitude information of HF transmission signal 42. The first limiting amplifier 40 converts the high-frequency phase-modulated first input signal 18 into a pulsed high-frequency phase-modulated first input signal 41. This latter pulse signal is delayed by means of the first delay unit 5 and the second delay unit 7. Output signal 23 from the first delay unit 5 leads output signal 24 from the second delay unit 7. I.e., the second delay is longer than the first delay.

Pulse generator 9 generates an output signal 22, which is likewise a pulsed signal, from its input signal, which is the same as output signal 23 from the first delay unit 5 and the output signal 24 from the second delay unit 7. The rising edge of output signal 22 of pulse generator 9 is triggered by the rising edge of output signal 22 of the first delay unit 5, and the falling edge of output signal 22 of pulse generator 9 is triggered by the rising edge of output signal 23 of the second delay unit 7. In this way, the pulse lengths of output signal 22 from pulse generator 9, of the amplified output signal 33, of the signals at the input of reconstruction filter 13 and of measuring signal 31 are controlled by the difference between the edge times of output signal 23 from the first delay unit 5 and the edge times of output signal 24 from the second delay unit 7.

Due to the amplitude of HF transmission signal 42 being proportional to the pulse length of the signal at the input of reconstruction filter 13, the amplitude of HF transmission signal 42 can be controlled by the position in time of the edges of output signal 23 from the first controllable delay unit 5 and the position of the edges of output signal 24 from the second controllable delay unit 7.

Amplitude detector 34 converts measuring signal 31 into feedback signal 26, which is a DC signal, the average value of the feedback signal being proportional to the pulse length of measuring signal 31. The amplitude detector may be realized in the form a rectifier, for example. Feedback signal 26 is then the same as the rectified measuring signal 31. Feedback signal 26 is subtracted from comparison signal 25 in first adder 27, and the first difference signal 29 is supplied to the first control input 6 via the first integrator 28 and inverter 47. In the second adder 44, feedback signal 26 is subtracted from comparison signal 25 and the second difference signal 46 is supplied to the second control input 8 via the second integrator 45.

The pulse length of the amplified output signal 33 from switched power amplifier 2 is fed back to the first delay unit 5 and the second delay unit 7 through coupler 30, amplitude detector 34, first adder 27, second adder 44, first integrator 28, inverter 47 and second integrator 45. This feedback operates as negative or degenerative feedback, the first delay and the second delay being controlled in such a way that the difference between feedback signal 26 and comparison signal 25 is averaged to zero at the inputs of the first integrator 28 and of the second integrator 45. In this way, comparison signal 25 is equal on average to feedback signal 26, so the pulse length of amplified output signal 33 from switched power amplifier 2 and hence the amplitude of HF transmission signal 42 can be controlled by comparison signal 25 and by the second input signal 19 which is applied to the second signal input 4.

The momentary phase $\phi_{RF}(t)$ and the carrier frequency $\omega_{RF}$ are likewise included in the amplified output signal 33 from switched power amplifier 2 and hence in HF transmission signal 42, so HF transmission signal 42 has the desired form $K*a(t)*\sin(\omega_{RF}*t+\phi_{RF}(t))$. Comparison signal 25 is generated from the second input signal 19 by means of a pulse-amplitude-to-pulse-length converter 43. This mainly serves the purpose of converting the second input signal 19 into a corresponding pulse length control variable, namely the comparison signal, so that amplified output signal 33 from switched power amplifier 2 has the desired pulse length, with the losses and sideband suppression being compensated in reconstruction filter 13, and the attenuation being compensated in coupler 30. The second input signal 19 may be converted into comparison signal 25 by multiplying the second input signal 19 by a constant.

The high-frequency transmission circuit 16 shown in FIG. 2 has low complexity and is composed of simple components. The linearity of the high-frequency transmission circuit, in particular the linearity of pulse length modulation, i.e. of the linear relationship between comparison signal 25 and the pulse length of the amplified output signal 33 from switched power amplifier 2, is assured when feedback signal 26 is equal to comparison signal 25 over the entire range of control.

This condition is substantially met when the first integrator 28 and the second integrator 45 have high DC gain, which can be achieved well with integrators based on operational amplifiers. Calibration of the first integrator 28 and the second integrator 45 is obviated by the fact that the DC gain of the first integrator 28 and of the second integrator 45 only has to be high enough to ensure linearity. Nonlinearities of switched power amplifier 2 at very small and very large pulse widths are also compensated, in particular, by the aforementioned feedback of the amplified output signal 33 from switched power amplifier 2. In comparison with the high-frequency transmission circuit 50 according to FIG. 1, the high-frequency transmission circuit 16 according to FIG. 2 does not require an HF triangle wave signal 64. When the first delay unit 5 and the second delay unit 7 have a sufficiently large delay range, which is the range of possible delays, then high-frequency transmission circuit 16 is well suited to multiband and multistandard applications.

In one preferred embodiment of upstream unit 1, output signal 22 from pulse generator 9 may be supplied instead of measuring signal 31 from coupler 30 to the input of amplitude detector 34. In another preferred configuration, coupler 30 and reconstruction filter 13 may be swapped so that the amplified output signal 33 from switched power amplifier 2 is supplied to the input of reconstruction filter 13, the output of reconstruction filter 13 is connected to the input of coupler 30, antenna 15 is connected to the output of coupler 30, and measuring signal 31 from coupler 30 is connected to the input of amplitude detector 34.

Figure 3:
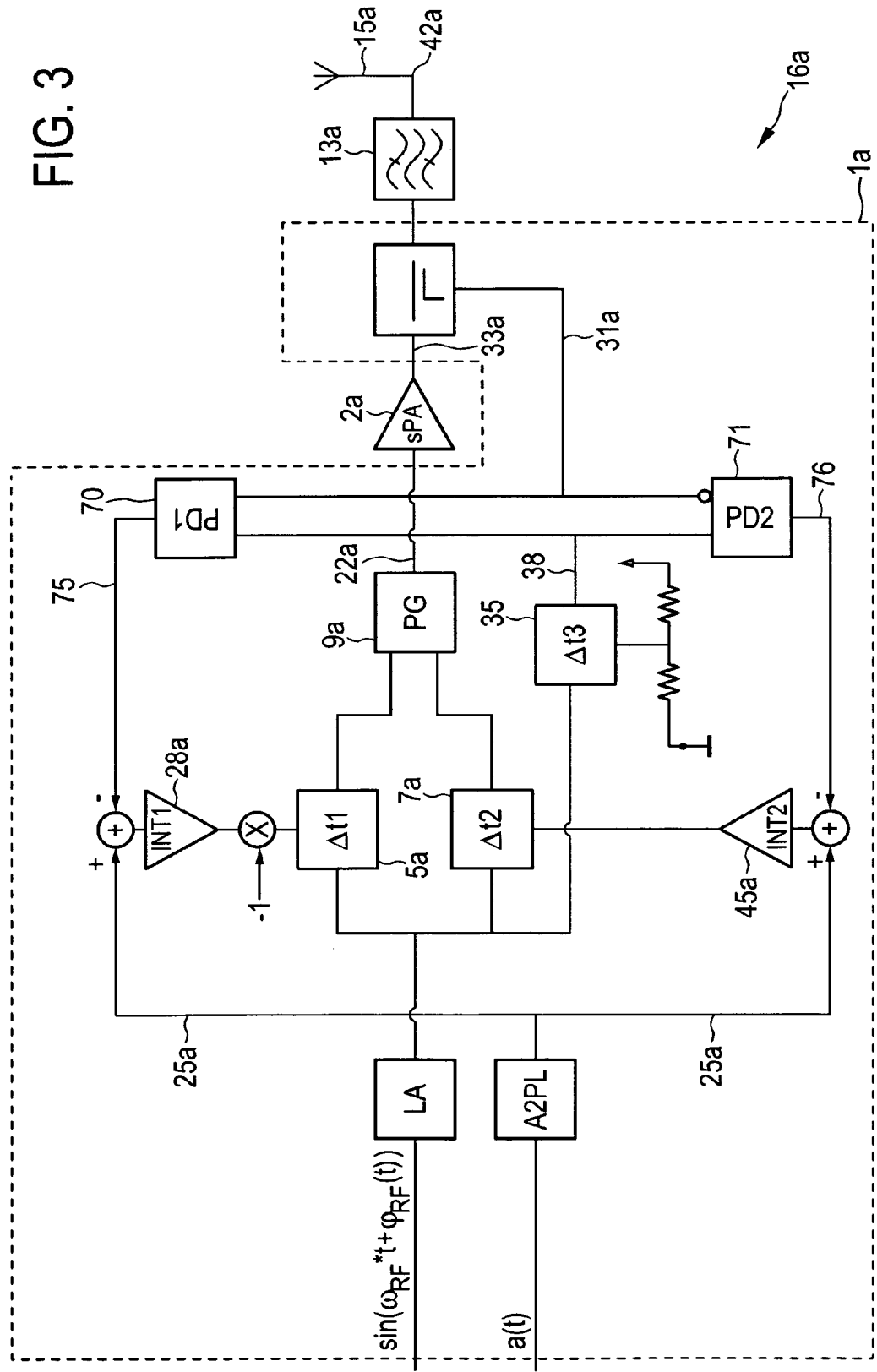

FIG. 3 shows a high-frequency transmission circuit 16a comprising an upstream unit 1a according to the invention, a switched power amplifier 2a, a low-pass reconstruction filter 13a and an antenna 15a. Upstream unit 1a in FIG. 3 differs from upstream unit 1 in FIG. 2 in that upstream unit 1a has a third delay unit 35 and, instead of amplitude detector 34, a phase detection unit comprising a first phase detector 70 and a second phase detector 71. The third delay unit 35 has a fixed delay. An output signal 22a from a pulse generator 9a is amplified by switched power amplifier 2a, which outputs an amplified output signal 33. A coupler 30a couples a measuring signal 31a from amplified output signal 33a. Measuring signal 31a is supplied to the first phase detector 70 and to the second phase detector 71, the first phase detector 70 detecting the positive edge and the second phase detector 71 detecting the negative edge of measuring signal 31a.

An output signal 38 from the third delay unit 35 is likewise supplied to the first phase detector 70 and to the second phase detector 71, which each detect the positive edge of output signal 38 from the third delay unit 35. An output signal 75 from the first phase detector 70 is subtracted from a comparison signal 25a, and the resultant difference signal is supplied to a first integrator 28a. An output signal 76 from the second phase detector 71 is subtracted from a comparison signal 25a, and the resultant difference signal is supplied to the second integrator 28a. The other parts of the high-frequency transmission circuit 16a shown in FIG. 3 correspond substantially to the respective parts of the high-frequency transmission circuit 16 shown in FIG. 2, so those parts are not described again at this point.

In the high-frequency transmission circuit 16a according to FIG. 3, unlike the high-frequency transmission circuit 16 according to FIG. 2, it is not the amplitude of measuring signal 31, but rather the rising edge of the respective measuring signal 31a that is detected by means of the first phase detector 70, and the falling edge is detected by means of the second phase detector 71, and the detected positions in time of the signal edges are compared with the positions in time of the rising edge of the output signal 38 from the third delay unit 35. Output signal 75 from the first phase detector 70 and output signal 76 from the second phase detector 71 each specify phase measurement values that are proportional to the measured differences between the respective edge times of their input signals.

The first delay of a first delay unit 5a and the second delay of a second delay unit 7a are controlled by negative feedback in such a way that the difference between comparison signal 25a and output signal 75 from the first phase detector 70, and the difference between comparison signal 25a and output signal 76 from the second phase detector 71 is respectively averaged to zero.

The positive edge of measuring signal 31a thus leads the edge of output signal 38 from the third delay unit 35, and the negative edge of measuring signal 31a lags the edge of output signal 38 from the third delay unit 35. The time differences between the positive edge of output signal 38 from delay unit 35 and the positive or negative edge, respectively, of measuring signal 74 are of equal amount. The negative and positive edges of measuring signal 31a are therefore symmetrical in relation to the positive edge of output signal 38 from the third delay member 35. The pulse length of measuring signal 31a and the pulse length of the amplified output signal 33a from switched power amplifier 2a is proportional to double the comparison signal 25a.

The high-frequency transmission circuit 16a according to FIG. 3 has all the advantages of the high-frequency transmission circuit 16 according to FIG. 2. High-frequency transmission circuit 16a can also compensate any asymmetrical switching behavior of power amplifier 2a. Switching behavior is asymmetrical when, for example, the positive edge of output signal 33a from switched power amplifier 2a differs in steepness from the negative edge. In this way, it is possible to compensate any unwanted phase modulation of an HF transmission signal 42a that may result from this asymmetric switching behavior. Another advantage of the high-frequency transmission circuit 16a according to FIG. 3 compared to the high-frequency transmission circuit 16 according to FIG. 2 is that the control loops for controlling the first delay in first delay unit 5a and the second delay in second delay unit 7a are completely decoupled from each other. In the high-frequency transmission circuit 16 according to FIG. 2, the respective control loops for the first delay and the second delay are coupled via amplitude detector 34, which may result in unwanted oscillations that are prevented in the high-frequency transmission circuit 16a according to FIG. 3.

The first phase detector 70 is preferably embodied as an XOR gate and the second phase detector 71 as an XOR gate with an inverter at one of the two inputs. At the output of the XOR gate, this results in a signal with a pulse length which is proportional on average to the measured time difference. Using an inverter at the input of an XOR gate can lead to unwanted variation during measurement, due to an additional signal delay in the inverter. To circumvent this problem, the XOR gates may be implemented in differential circuit technology, for example. An input signal to an XOR gate can then be inverted by swapping the signal lines such that the input to the first phase detector 70 and the input to the second phase detector 71 have identical delay times, thus preventing any variation in measurement of the edge times.

In one preferred configuration of the upstream unit 1a according to FIG. 3, output signal 22a from pulse generator 9a, rather than measuring signal 31a from coupler 30a, is fed back to the first phase detector 70 and to the second phase detector 71.

Figure 4:
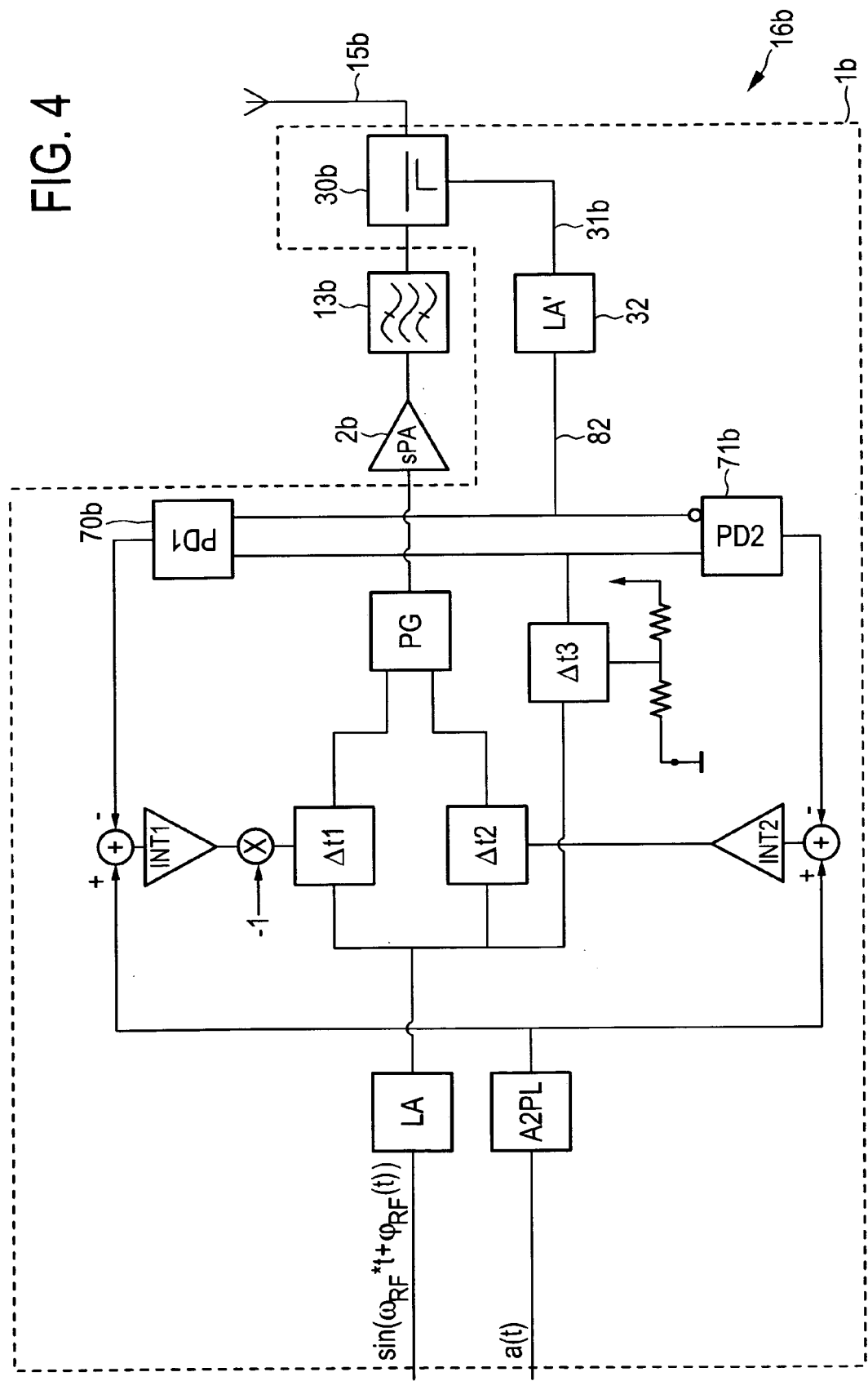

FIG. 4 shows a further embodiment of an upstream unit 1b for a switched power amplifier 2b of an HF transmission circuit 16b. In the high-frequency transmission circuit 16b according to FIG. 4, a coupler 30b and a reconstruction filter 13b have been swapped in comparison with the high-frequency transmission circuit 16a according to FIG. 3, with the consequence that an output signal 33b from switched power amplifier 2b is applied to the input of reconstruction filter 13b, the output signal of reconstruction filter 13b is connected to the input of coupler 30b and the output signal from coupler 30b is supplied to an antenna 15b, and that a measuring signal 31b from coupler 30b is connected to the input of a second limiting amplifier 32 and output signal 82 from the second limiting amplifier 32 is connected to an input of a first phase detector 70b and to the inverting input of a second phase detector 71b.

Other parts of the high-frequency transmission circuit 16b according to FIG. 4 are correspond substantially to the respective parts of high-frequency transmission circuit 16a and 16 according to FIG. 3 and FIG. 2, so these parts are not described again at this point.

Figure 5:
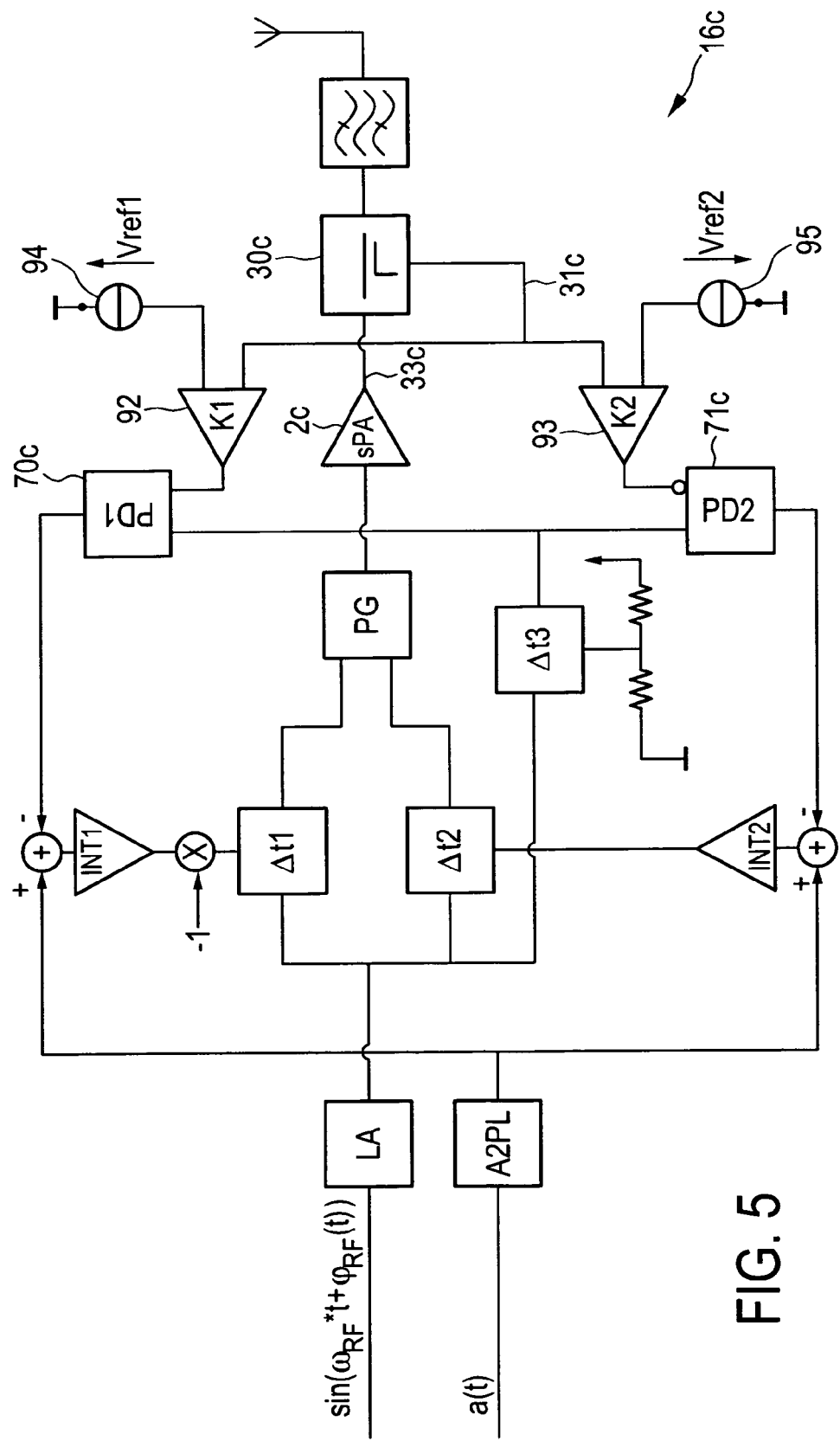

FIG. 5 shows another embodiment of an upstream unit for a switched power amplifier 2c of a high-frequency transmission circuit 16c. The high-frequency transmission circuit 16c according to FIG. 5 is identical in many respects to the high-frequency transmission circuit 16b in FIG. 4. However, a measuring signal 31c from a coupler 30c is not supplied directly to a first phase detector 70c and to a second phase detector 71c, but instead to the inputs of a first comparator 92 and a second comparator 93. A first reference voltage 94 is also applied to the first comparator 92a and a second reference voltage 95 is applied to the second comparator 93a. An output signal from the first comparator 92 is applied to one input of the first phase detector 70 and an output signal from the second comparator 93 is applied to the inverting input of the second phase detector 71.

By separately adjusting the first reference voltage 94 and the second reference voltage 95, the edge times of the rising and falling edges of an output signal 33c of switched power amplifier 2c can be detected with different reference voltages. The edge times of the rising and falling edges of output signal 33c of switched power amplifier 2c can thus be detected more precisely, as a result of which it is possible, for example, to achieve greater linearity in high-frequency transmission circuit 16c.

Figure 6:
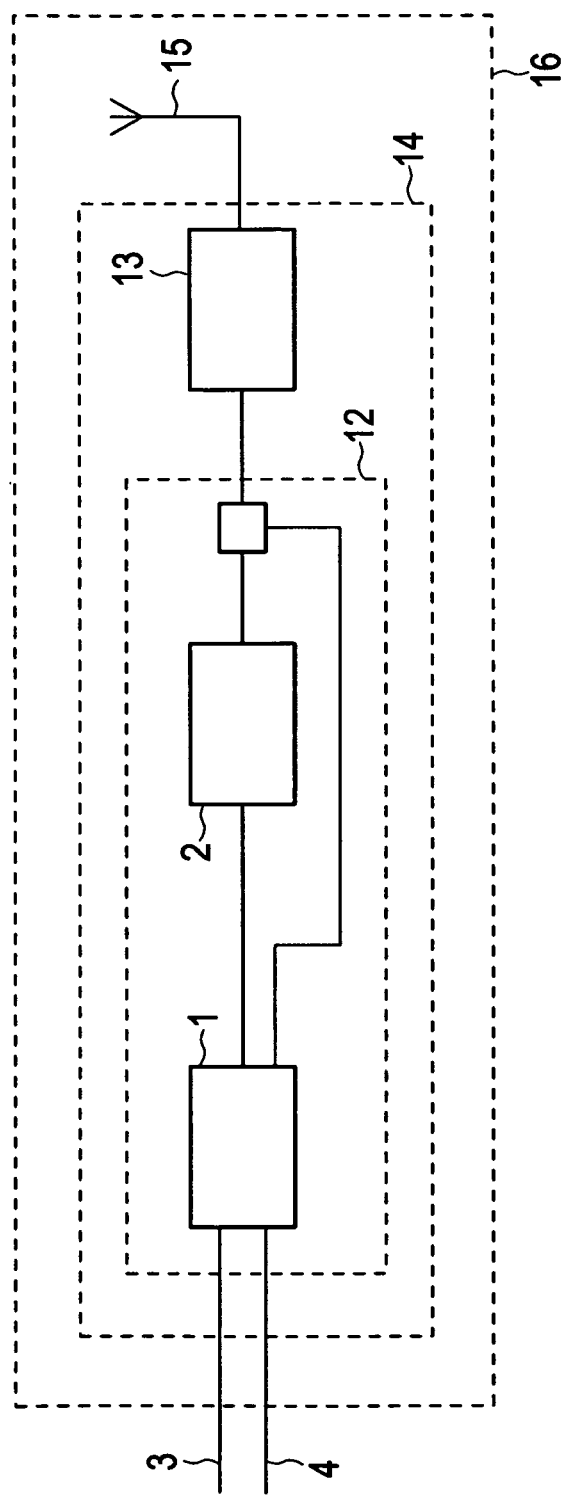

FIG. 6 shows units containing an upstream unit 1 according to the invention. They include a circuit unit 12 comprising upstream unit 1 and switched power amplifier 2. In combination with a reconstruction filter 13, circuit unit 12 forms a high-frequency switching module 14. High-frequency transmission circuit 16 contains high-frequency switching module 14 and antenna 15. High-frequency transmission circuit 16 may be used, for example, as a component in a transmitter device.

What is claimed is:

1. An upstream unit (1) for a switched power amplifier (2) of a high-frequency transmission circuit (16), comprising
a first signal input (3) for a high-frequency, phase-modulated first input signal (18, 41);
a second signal input (4) for a second input signal (19) having a low frequency in comparison with the first input signal (18);
a controllable first delay unit (5) to which the first input signal (18) is supplied and to which a first control signal (20) is supplied via a first control input (6) and which is configured to output the first input signal (18) with a first delay that depends on the first control signal (20);
a controllable second delay unit (7) to which the first input signal (18) is supplied and to which a second control signal (21) is supplied via a second control input (8) and which is configured to output the first input signal (18) with a second delay that depends on the second control signal and which is longer than the first delay;
a pulse generator (9) which is connected on the input side to the first and to the second delay unit (5, 7) and configured to generate and output a pulsed and pulse-length modulated output signal (22), wherein the duration of the rising edges of the output signal (22) from the pulse generator (9) depends on the output signal (23) from the first delay unit (5) and the duration of the falling edges of the output signal (22) from the pulse generator depend on the output signal (24) from the second delay unit (7); and
a control unit (10) which is configured to generate and output the first control signal (20) according to the second input signal (19) and the output signal (22) from the pulse generator (9) and to generate and output the second control signal (21) according to the second input signal (3) and the output signal (22) from the pulse generator.

2. The upstream unit (1) according to claim 1, wherein the control unit (10) includes a comparator unit (27, 44) which is configured to determine the first control signal (20) and the second control signal (21) on the basis of a comparison between a comparison signal (25) which depends on the second input signal (19) and at least one feedback signal (26) which depends on the output signal (22).

3. The upstream unit according to claim 2, wherein the comparator unit (27, 44) includes at least one adder unit (27) which is configured to determine at least one difference signal (29) from the comparison signal (25) and the at least one feedback signal (26).

4. The upstream unit according to claim 3, wherein the comparator unit includes at least one integrator unit (28, 45) which is configured to determine the first control signal (20) in inverted form and/or the second control signal (21) by integrating the at least one difference signal (29).

5. The upstream unit according to claim 4, wherein the at least one integrator unit (28) is realized with at least one integrator based on at least one operational amplifier.

6. The upstream unit (1) according to claim 1, wherein the control unit (10) includes at least one coupler (30) which is configured to decouple a measuring signal (31) from the output signal (22) of the pulse generator (9) or from a signal that depends on the output signal (22) of the pulse generator (9).

7. The upstream unit (1) according to claim 6, wherein the control unit (10) includes a second limiting amplifier (32)

which is configured to determine the measuring signal (31) from a signal which is filtered by a reconstruction filter (13) and dependent on the output signal (22).

8. The upstream unit (1) according to claim 6, wherein the control unit (10) includes an amplitude detector (34) which is configured to detect the at least one feedback signal (26) from the measuring signal (31) by rectification.

9. The upstream unit (1) according to claim 6, comprising a third delay unit (35) to which the first input signal (18) is supplied and which is configured to output the first input signal (18) with a third constant delay, wherein the output signal (38) is supplied to the third delay unit (35) and the measuring signal (31) is supplied to a phase detection unit (70, 71) which is configured to detect the at least one feedback signal (26) from the output signal (38) of the third delay unit (35) and from the measuring signal (31) in such a way that the at least one feedback signal (26) is proportional to a phase difference between the output signal (38) of the third delay unit (35) and the measuring signal (31).

10. The upstream unit (1) according to claim 1, wherein a first limiting amplifier (40) is connected downstream from the first signal input and configured to convert the high-frequency, phase modulated first input signal (18) into a high-frequency, phase modulated, pulsed first input signal (41).

11. The upstream unit (1) according to claim 1, wherein a pulse-amplitude-to-pulse-length converter (43) is connected downstream from the second signal input and configured to convert the second input signal (19) into the comparison signal.

12. A circuit unit (12), comprising one upstream unit (1) according to claim 1 and a switched power amplifier (2) to which the output signal (22) is supplied and which is configured to output an amplified output signal (33).

13. A high-frequency circuit module (14) which includes the circuit unit (12) of claim 12 and a reconstruction filter (13) for reconstructing the amplified output signal (33) and which is configured to output an antenna signal (42).

14. A high-frequency transmission circuit (16) which includes the high-frequency circuit module (14) of claim 13 and an antenna (15) for emitting the antenna signal (42).

15. A transmission device (17) that includes the high-frequency transmission circuit (16) according to claim 14, for transmitting a radio-frequency signal.

\* \* \* \* \*